United States Patent
Saito et al.

(10) Patent No.: US 9,042,008 B2
(45) Date of Patent: May 26, 2015

(54) OPTICAL SEMICONDUCTOR DEVICE

(71) Applicant: Mitsubishi Electric Corporation, Tokyo (JP)

(72) Inventors: Takeshi Saito, Tokyo (JP); Masakazu Takabayashi, Tokyo (JP); Eitaro Ishimura, Tokyo (JP); Tohru Takiguchi, Tokyo (JP); Kazuhisa Takagi, Tokyo (JP); Keisuke Matsumoto, Tokyo (JP); Yoshifumi Sasahata, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 14/210,882

(22) Filed: Mar. 14, 2014

(65) Prior Publication Data

US 2014/0198378 A1 Jul. 17, 2014

Related U.S. Application Data

(62) Division of application No. 13/675,449, filed on Nov. 13, 2012, now abandoned.

(30) Foreign Application Priority Data

Feb. 15, 2012 (JP) ................. 2012-030779

(51) Int. Cl.
*H01S 3/067* (2006.01)
*H01S 5/026* (2006.01)
(Continued)

(52) U.S. Cl.
CPC ............ *H01S 3/067* (2013.01); *H01S 3/10053* (2013.01); *H01S 3/107* (2013.01); *H01S 5/026* (2013.01);
(Continued)

(58) Field of Classification Search
CPC ....... H01S 3/067; H01S 5/026; H01S 5/4062; H01S 5/0654; H01S 5/12; H01S 5/0265; H01S 3/107; H01S 3/10053; H01S 5/14
USPC ......................................... 359/344
See application file for complete search history.

(56) References Cited

U.S. PATENT DOCUMENTS 4,896,325 A 1/1990 Coldren
5,039,194 A * 8/1991 Block et al. ............. 385/88
(Continued)

FOREIGN PATENT DOCUMENTS

JP 4-37182 A 2/1992
JP 7-15092 A 1/1995
(Continued)

OTHER PUBLICATIONS

Ishii et al.; "Spectral Linewidth Reduction in Widely Wavelength Tunable DFB Laser Array", *IEEE J. of Selected Topics in Quantum Electronics*, vol. 15, No. 3, (May/Jun. 2009) pp. 514-520.

*Primary Examiner* — Ari M Diacou
(74) *Attorney, Agent, or Firm* — Leydig, Voit & Mayer, Ltd.

(57) ABSTRACT

An optical semiconductor device includes: semiconductor lasers; a wave coupling section multiplexing light output by the semiconductor lasers; first optical waveguides respectively optically connecting respective semiconductor lasers to the wave coupling section; a phase regulator regulating phase of reflected light that is reflected at a reflecting point located in the optical semiconductor device and that returns to the semiconductor lasers; a second optical waveguide optically connecting the wave coupling section to the phase regulator; an optical amplifying section amplifying output light of the phase regulator; and a third optical waveguide optically connecting an output of the phase regulator to the optical amplifying section. The phase regulator adjusts the phase of reflected light that returns to the semiconductor lasers to decrease line width of the light output by the semiconductor lasers.

10 Claims, 3 Drawing Sheets

(51) Int. Cl.
*H01S 5/065* (2006.01)
*H01S 5/40* (2006.01)
*H01S 3/10* (2006.01)
*H01S 3/107* (2006.01)
*H01S 5/12* (2006.01)
*H01S 5/14* (2006.01)
*H04J 14/02* (2006.01)

(52) U.S. Cl.
CPC ............. *H01S 5/0265* (2013.01); *H01S 5/0654* (2013.01); *H01S 5/12* (2013.01); *H01S 5/14* (2013.01); *H01S 5/4062* (2013.01); *H04J 14/02* (2013.01)

(56) References Cited

U.S. PATENT DOCUMENTS

| | | | |
|---|---|---|---|
| 5,088,097 A * | 2/1992 | Ono et al. | 372/20 |
| 5,155,736 A * | 10/1992 | Ono et al. | 372/20 |
| 5,175,643 A * | 12/1992 | Andrews | 359/339 |
| 5,299,045 A * | 3/1994 | Sekiguchi | 398/95 |
| 5,334,854 A * | 8/1994 | Ono et al. | 257/13 |
| 5,394,489 A | 2/1995 | Koch | |
| 5,396,506 A | 3/1995 | Ball | |
| 5,565,693 A | 10/1996 | Sasaki et al. | |
| 5,651,018 A | 7/1997 | Mehuys et al. | |
| 5,745,613 A | 4/1998 | Fukuchi et al. | |
| 5,757,832 A | 5/1998 | Uchida | |
| 5,870,512 A | 2/1999 | Koch et al. | |
| 5,892,607 A | 4/1999 | Atlas | |
| 6,252,693 B1 | 6/2001 | Blauvelt | |
| 6,275,317 B1 | 8/2001 | Doerr et al. | |
| 6,434,175 B1 | 8/2002 | Zah | |
| 6,490,044 B1 | 12/2002 | Koch et al. | |
| 6,583,901 B1 * | 6/2003 | Hung | 398/79 |
| 6,678,294 B1 | 1/2004 | Komine et al. | |
| 6,775,478 B2 | 8/2004 | Suzuki et al. | |
| 7,079,715 B2 | 7/2006 | Kish, Jr. et al. | |
| 7,436,586 B2 * | 10/2008 | Otsubo et al. | 359/344 |
| 7,502,395 B2 * | 3/2009 | Cheng et al. | 372/32 |
| 7,548,575 B1 | 6/2009 | Jackson et al. | |
| 7,574,139 B2 | 8/2009 | Fu et al. | |
| 7,586,960 B2 * | 9/2009 | Hu | 372/28 |
| 7,633,988 B2 * | 12/2009 | Fish et al. | 372/50.22 |
| 7,729,398 B2 | 6/2010 | Livingston | |
| 7,756,169 B2 | 7/2010 | Livingston et al. | |
| 8,031,394 B2 * | 10/2011 | Otsubo et al. | 359/332 |
| 8,155,161 B2 * | 4/2012 | Fukuda | 372/43.01 |
| 8,391,708 B1 * | 3/2013 | Priyadarshi et al. | 398/15 |
| 8,531,761 B2 | 9/2013 | Chann et al. | |
| 2001/0015837 A1 * | 8/2001 | Hung | 359/124 |
| 2002/0064333 A1 | 5/2002 | Shigeta et al. | |
| 2003/0095737 A1 | 5/2003 | Welch et al. | |
| 2003/0123132 A1 * | 7/2003 | Hu et al. | 359/333 |
| 2003/0161370 A1 * | 8/2003 | Buimovich et al. | 372/50 |
| 2004/0033004 A1 | 2/2004 | Welch et al. | |
| 2004/0067006 A1 * | 4/2004 | Welch et al. | 385/14 |
| 2004/0101313 A1 * | 5/2004 | Akiyama | 398/174 |
| 2004/0228564 A1 | 11/2004 | Gunn, III et al. | |
| 2004/0247233 A1 | 12/2004 | Grubb et al. | |
| 2005/0094927 A1 * | 5/2005 | Kish et al. | 385/14 |
| 2005/0128554 A1 | 6/2005 | Wickham et al. | |
| 2005/0201429 A1 | 9/2005 | Rice et al. | |
| 2005/0244994 A1 | 11/2005 | Meliga et al. | |
| 2006/0013273 A1 * | 1/2006 | Menon et al. | 372/32 |
| 2006/0093362 A1 * | 5/2006 | Welch et al. | 398/87 |
| 2007/0086010 A1 | 4/2007 | Rothenberg | |
| 2007/0201795 A1 | 8/2007 | Rice et al. | |
| 2009/0129414 A1 * | 5/2009 | Gollier | 372/20 |
| 2009/0284828 A1 * | 11/2009 | Sosabowski et al. | 359/326 |
| 2010/0142567 A1 * | 6/2010 | Ward et al. | 372/20 |
| 2011/0032603 A1 | 2/2011 | Rothenberg | |
| 2011/0122484 A1 | 5/2011 | Gaudiosi et al. | |
| 2011/0292498 A1 | 12/2011 | Chann et al. | |
| 2012/0014397 A1 | 1/2012 | Chann et al. | |
| 2012/0162648 A1 * | 6/2012 | Busico et al. | 356/402 |
| 2013/0094074 A1 | 4/2013 | Asghari et al. | |
| 2013/0121687 A1 * | 5/2013 | Sartorius et al. | 398/25 |
| 2013/0208350 A1 | 8/2013 | Saito et al. | |
| 2013/0235890 A1 * | 9/2013 | Creazzo et al. | 372/20 |
| 2014/0027708 A1 * | 1/2014 | Goyal et al. | 257/9 |
| 2014/0362433 A1 * | 12/2014 | Adams et al. | 359/344 |
| 2015/0063740 A1 * | 3/2015 | Gotoda et al. | 385/2 |

FOREIGN PATENT DOCUMENTS

| | | |
|---|---|---|
| JP | 9-83087 A | 3/1997 |
| JP | 2007-194340 A | 8/2007 |
| JP | 2009-246390 A | 10/2009 |

* cited by examiner

OPTICAL SEMICONDUCTOR DEVICE

BACKGROUND OF THE INVENTION

1. Field of the Invention

The present invention relates to a wavelength-variable optical semiconductor device used in optical communication systems. Specifically, the present invention relates to an optical semiconductor device wherein the increase of spectral line width due to the reflected light being reflected at the reflecting point present in the device and returning to the semiconductor laser can be inhibited.

2. Background Art

In the long distance communication system using relay by an optical amplifier, DWDM (Dense Wavelength Division Multiplexing) is used for increasing the transmission volume for one optical fiber. In this system, optical signals of about 80 different wavelengths are multiplexed in one fiber. At present, the development of wavelength-variable lasers that can oscillate at optional wavelengths from the used wavelength band has progressed, which has become the mainstream of the light source for long-distance optical transceivers.

As a modem method, an IM-DD (Intensity Modulation-Direct Detection) system has been used in systems having the signal speed of up to 10 Gbit/s. In recently penetrating 40 Gbit/s system, phase modulation and differential detection methods are used. In the digital coherent system adopted in next-generation 100 Gbit/s systems, phase modulation systems are used. In the signal receiving side, a coherent detection system wherein local light and signal light are mixed to detect the intensity and phase information are used.

In the conventional IM-DD system, since no phase information of the light is used, it is enough if the light source oscillates at a single wavelength, the phase noise causes no problems. However, in the digital coherent system, the phase noise of the signal light source and the local light source causes the deterioration of signal qualities. Although a spectrum line width is used as the indicator showing the size of the phase noise of the light source, it is required to narrow the spectrum line width for lowering the phase noise.

As a method for realizing the wavelength-variable light source, an optical semiconductor device wherein a plurality of semiconductor lasers and optical amplifying sections are accumulated has been reported. In this method, any one of a plurality of semiconductor lasers arrayed in parallel is made to flash, and the output light thereof is output from a waveguide via a wave coupling section. By amplifying the output light in the optical amplifying section, light having a desired wavelength is output at a desired optical power.

The spectrum line width Vo has generally the relationship shown in the following numerical expression 1.

Expression 1

$$V_0 \propto (k L_{DFB})^{-2} (L_{DFB})^{-1} (1+\alpha^2)$$

For realizing a narrow line width, it is desired to lengthen the laser length $L_{DFB}$. Also in the above described optical semiconductor device wherein the semiconductor lasers and the optical amplifying sections are accumulated, it has been reported that the low line width of 1 MHz or below is realized by lengthening the laser length. However, there are causes to deteriorate the spectrum line width. In the case wherein a reflectivity on the front end surface is limited, the light reflected by the front end surface is again amplified by the optical amplifying section, and the reflected light returns to the semiconductor laser and causes adverse effects.

When a reflectivity on the front end surface is made to be R0, the spectrum line width Δv when fed back is represented the following Numerical Expression 2 (for example, refer to IEEE JOURNAL OF SELECTED TOPICS IN QUANTUM ELECTRONICS, Vol. 15, No. 3, May/June 2009, pp. 514-520).

$$\frac{\Delta v}{v_0} = \frac{1}{[1 + C\sin\{\omega\tau + \phi_C + \arctan(\alpha)\}]^2} \quad \text{[Expression 2]}$$

Where, there is the relationship of the following numerical expressions 3 and 4.

$$C = \sqrt{R_{ext}} \, L_{ext} \frac{P_{DFB}}{P_{av} L_{DFB}} \sqrt{K_Z} \sqrt{1+\alpha^2} \quad \text{[Expression 3]}$$

$$R_{ext} = R_0 \left(\frac{P_{SOA}}{P_{DFB}}\right)^2 \quad \text{[Expression 4]}$$

Where, $v_0$ represents the line width when C=0, i.e. R=0; τ represents the time required for one round trip of the oscillator exterior to LD.

From the Numerical expression 2, when there is the feedback due to reflections, the spectra line width changes periodically, and becomes maximum when it is nearly $$C \sin\{\omega\tau + \phi c_+ \arctan(\alpha)\} = -1$$

When change in the angular frequency for the current value applied to the laser is approximated as in the following Numerical expression 5, the line width changes periodically by the current values applied to the semiconductor laser as shown in FIG. 3 (a) in IEEE JOURNAL OF SELECTED TOPICS IN QUANTUM ELECTRONICS, Vol. 15, No. 3, May/June 2009, pp. 514-520).

Expression 5

$$\omega - \omega_0 = aI^2_{DFB} + bI_{DFB}$$

SUMMARY OF THE INVENTION

In reality, the end-face reflectivity cannot be 0, but there is always a limited reflectivity. Therefore, the spectra line widths of a conventional optical semiconductor device wherein semiconductor lasers and optical amplifying sections are accumulated changes periodically depending upon the current values of the semiconductor lasers, and at times, increase causing problems on the system may be caused. Furthermore, when modulators or the like are further accumulated, reflection may occur from each part or the like to constitute the modulators, and similarly, the increase of the spectra line width may be caused.

As long as such a limited reflectivity of a front end surface or a reflection point present in the device is present, the reflected light returns to the semiconductor laser after the reflected light is amplified in the optical amplifying section. Therefore, there was a problem wherein the increase of the spectra line width is caused depending on the driving current conditions of the semiconductor laser.

In view of the above-described problems, an object of the present invention is to provide an optical semiconductor device which can inhibit the increase of the spectra line width by the reflected light.

According to the present invention, an optical semiconductor device includes: a plurality of semiconductor lasers; a wave coupling section multiplexing output light of the plurality of the semiconductor lasers; an optical amplifying section amplifying output light of the wave coupling section; a first optical waveguide respectively optically connecting the plurality of semiconductor lasers to the wave coupling section; a second optical waveguide optically connecting the wave coupling section to the optical amplifying section; a third optical waveguide optically connected to an output of the optical amplifying section; and a phase regulator provided in at least one of the first, second, and third optical waveguides, and regulating a phase of reflected light that is reflected at a reflecting point present in the optical semiconductor device and returns to the plurality of semiconductor lasers. The phase regulator adjusts the phase of the reflected light so as to decrease line width of the output light of the plurality of semiconductor lasers.

The present invention makes it possible to inhibit the increase of the spectra line width by the reflected light.

Other and further objects, features and advantages of the invention will appear more fully from the following description.

DETAILED DESCRIPTION OF THE PREFERRED EMBODIMENTS

An optical semiconductor device according to the embodiments of the present invention will be described with reference to the drawings. The same components will be denoted by the same symbols, and the repeated description thereof may be omitted.

First Embodiment

Figure 1:
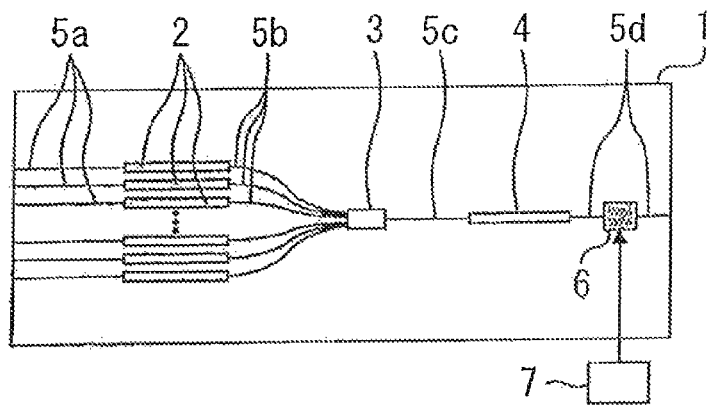
FIG. 1 is a top view showing an optical semiconductor device according to the first embodiment of the present invention.

FIG. 1 is a top view showing an optical semiconductor device according to the first embodiment of the present invention. On an InP substrate 1, a plurality of semiconductor lasers 2, a wave coupling section 3, an optical amplifying section 4, optical waveguides 5a, 5b, 5c, and 5d, and a phase regulator 6 are accumulated. A plurality of semiconductor lasers 2 are the DFB-LD (Distributed Feedback Laser Diode) array. The wave coupling section 3 is an MMI coupler (Multi-Mode Interference). The optical amplifying section 4 is an SOA (Semiconductor Optical Amplifier). A control section 7 controls the bias applied to the phase regulator 6 and controls the phase regulator 6.

The wave coupling section 3 multiplexes the output light of a plurality of the semiconductor lasers 2. The optical amplifying section 4 amplifies the output light of the wave coupling section 3. The optical waveguide 5a is optically connected to the input side of the semiconductor lasers 2. A plurality of optical waveguides 5b respectively optically connect a plurality of semiconductor lasers 2 to the wave coupling section 3. The optical waveguide 5c optically connects the wave coupling section 3 to the optical amplifying section 4. The optical waveguide 5d is optically connected to the output of the optical amplifying section 4. The phase regulator 6 is provided in the optical waveguide 5d, and specifically, an electrode to which a bias is applied to the upper portion of the optical waveguide 5d is provided. The phase regulator 6 regulates the phase of the light that is reflected at reflecting points present in the device and returns to a plurality of semiconductor lasers 2.

When the control section 7 applies a forward bias or a reverse bias to the phase regulator 6, by the carrier plasma effect in the forward bias applying time, by the quantum confined Stark effect or the like in the reverse bias applying time, the reflectivity of the optical waveguide 5d is varied, and the light path length is varied. Therefore, τ in the numerical expression 2 is varied, and the term of sin in the numerical expression 2 can be optimized (where sin {ωτ+φ$_c$+arctan (α)}=1). As described above, by adjusting the bias applied to the phase regulator 6, the spectrum line width Δν can be minimized. In addition, in the numerical expression 2, although the front end surface is assumed as the reflecting point, the feedback from the reflecting point other than the front end surface can be also expressed by a similar numerical expression by replacing R0 of the numerical expression 4 with the reflectivity of the reflecting point.

Then, the control section 7 adjusts the bias applied to the phase regulator 6, and makes the phase regulator 6 adjust the phase of the reflected light so as to decrease the line width of the output light of a plurality of semiconductor lasers 2. Thereby, the increase of the spectra line width by the reflected light can be inhibited.

Figure 2:
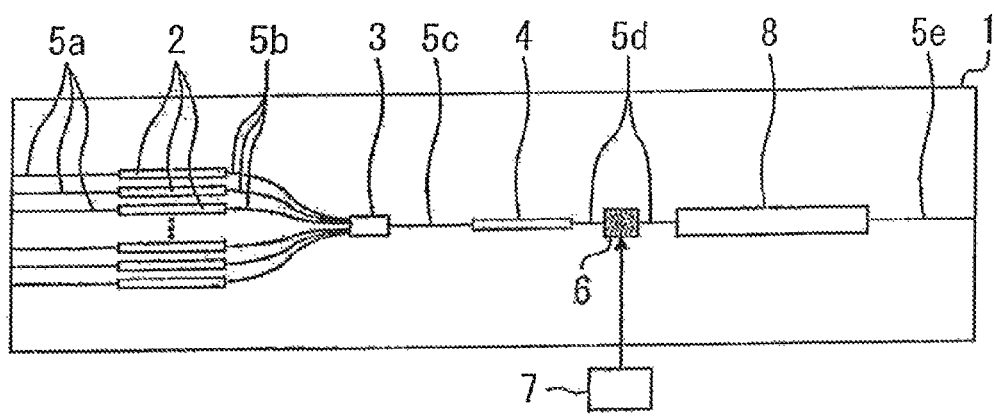
FIG. 2 is a top view showing a modified example 1 of the optical semiconductor device according to the first embodiment of the present invention.
Figure 3:
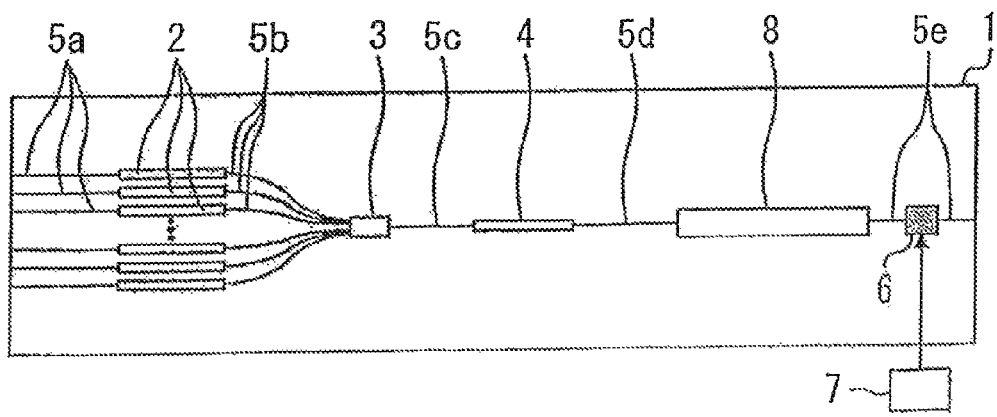
FIG. 3 is a top view showing a modified example 2.

FIG. 2 is a top view showing a modified example 1 of the optical semiconductor device according to the first embodiment of the present invention. FIG. 3 is a top view showing a modified example 2. In addition to the configuration in the first embodiment, an optical modulator 8 is optically connected to the output of the optical amplifying section 4. In the modified example 1, the phase regulator 6 is provided between the optical amplifying section 4 and the optical modulator 8. In the modified example 2, the phase regulator 6 is provided in the optical waveguide 5e in the output side of the optical modulator 8. In these cases, an effect similar to the effect of the first embodiment can also be obtained.

In this time, the optical waveguide 5a can be omitted. The layer constructions of the optical waveguides 5a, 5b, 5c, and 5d can be identical to the semiconductor laser 2 or the optical amplifying section 4, or can be butt-jointed waveguides having different construction and configuration. The optical modulator 8 can be a plurality of optical modulators connected in series.

Second Embodiment

Figure 4:
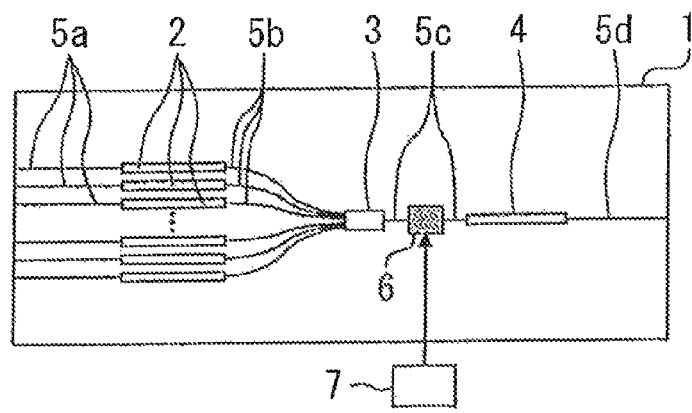
FIG. 4 is a top view showing an optical semiconductor device according to the second embodiment of the present invention.

FIG. 4 is a top view showing an optical semiconductor device according to the second embodiment of the present invention. The phase regulator 6 is provided in the optical waveguide 5c. In this case also, an effect similar to that in the first embodiment can be obtained.

Figure 5:
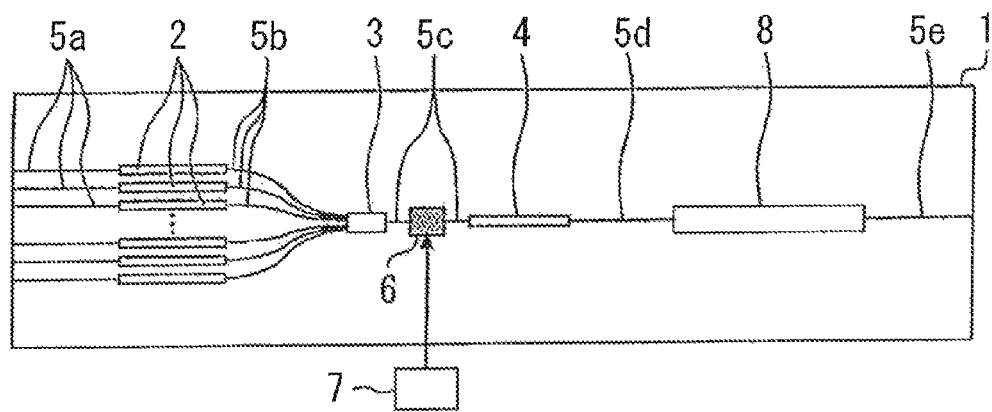
FIG. 5 is a top view showing the modified example of the optical semiconductor device according to the second embodiment of the present invention.

FIG. 5 is a top view showing the modified example of the optical semiconductor device according to the second embodiment of the present invention. In addition to the constitution of the second embodiment, the optical modulator 8 is optically connected to the output of the optical amplifying section 4. In this case also, an effect similar to that in the first embodiment can be obtained.

Third Embodiment

Figure 6:
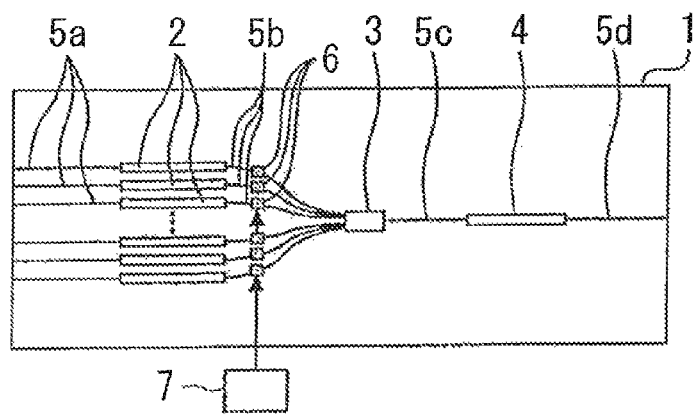
FIG. 6 is a top view showing an optical modulator according to the third embodiment of the present invention.

FIG. 6 is a top view showing an optical modulator according to the third embodiment of the present invention. A plurality of phase regulators 6 are respectively provided in a plurality of optical waveguides 5b. In this case also, an effect similar to that in the first embodiment can be obtained.

Figure 7:
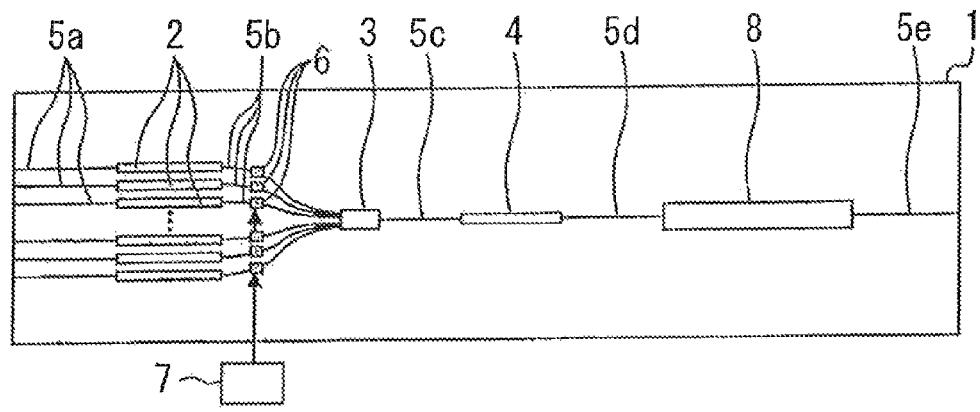
FIG. 7 is a top view showing the modified example of the optical semiconductor device according to the third embodiment of the present invention.

FIG. 7 is a top view showing the modified example of the optical semiconductor device according to the third embodiment of the present invention. In addition to the configuration of the third embodiment, the optical modulator 8 is optically connected to the output of the optical amplifying section 4. In this case also, an effect similar to that in the first embodiment can be obtained.

In first to third embodiments, although the phase regulators 6 are respectively provided in the optical waveguides 5d, 5c, and 5b, the present invention is not limited thereto, but the phase regulator 6 is not limited thereto, but the phase regulator 6 may be provided in at least one of the optical wave guides 5b, 5c, and 5d.

Fourth Embodiment

Figure 8:
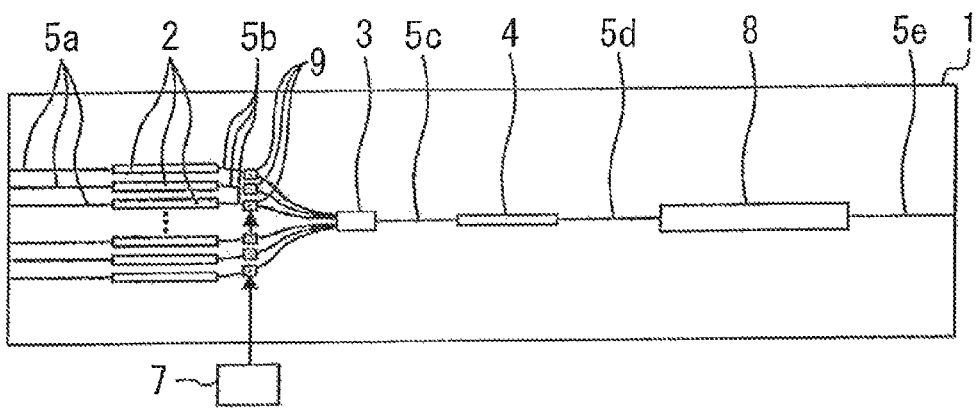
FIG. 8 is a top view showing an optical semiconductor device according to the fourth embodiment of the present invention.

FIG. 8 is a top view showing an optical semiconductor device according to the fourth embodiment of the present invention. In place of the phase regulator 6 to adjust the phase of the reflected light, a light intensity lowering section 9 to lower the light intensity of the reflected light is provided in the optical waveguide 5b.

The layer configuration of the light intensity lowering section 9 is identical to the layer configuration of the phase regulator 6. The control section 7 supplies a larger bias to the light intensity lowering section 9 than to the phase regulator 6, and positively generates light absorption. When light absorption occurs in the light intensity lowering section 9, the intensity of the light inputted from the semiconductor lasers 2 to the optical amplifying section 4 is lowered. However, in the optical amplifying section 4, if the input reaches a constant value or more, the saturation of the gain occurs. Using this characteristic, by adjusting current value to the semiconductor lasers 2 so that the power of light after passing through the light intensity lowering section 9 is in the region of the gain saturation of the optical amplifying section 4, the effect of the loss by the light intensity lowering section 9, the effect of the loss by the intensity lowering section 9 can be ignored.

On the other hand, the reflected light from the reflection point in the device on the front end surface or on the side nearer to the front end surface than the optical amplifying section 4 is amplified by the optical amplifying section 4, and returns to the semiconductor laser 2. Before this, the light intensity lowering section 9 lowers the light intensity of the reflected light. Therefore, the effect of the reflected light on the semiconductor laser 2 is weakened, and the line width of output light of a plurality of semiconductor lasers 2 is decreased. Therefore, the control section 7 adjusts the bias applied to the light intensity lowering section 9, and makes the light intensity lowering section 9 lower the light intensity of the reflected light so that the line width of the output light. Thereby, the increase of the spectrum line width by the reflected light can be inhibited.

In addition, by reversed biasing the light intensity lowering section 9, the loss of the reflected light occurs, and at the same time, change in the phase also occurs. Therefore, since the effect of the third embodiment can also be obtained, the periodical change of the line width observed in the numerical expression 2 occurs. As the bias point, in addition to the effect by the above-described absorption, the bias point to be the most suitable in the points of the phase must be searched. Furthermore, the optical waveguide 5a or the optical modulator 8 can be omitted.

Figure 9:
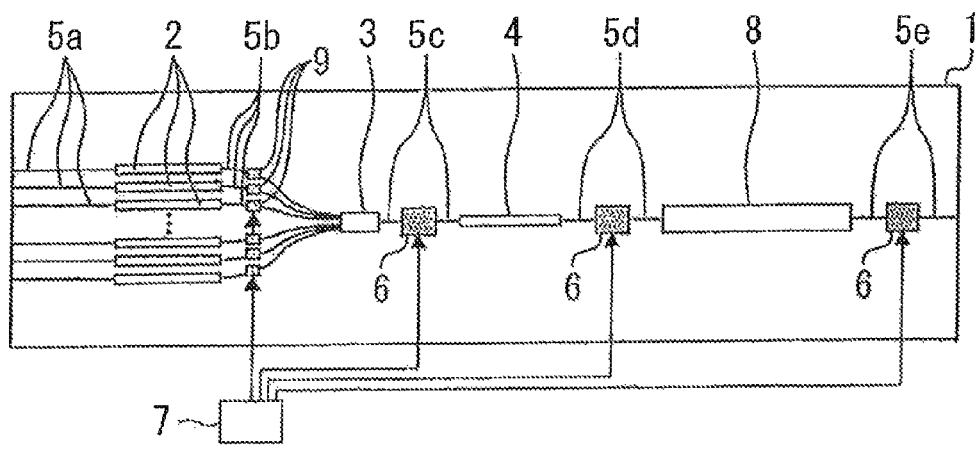
FIG. 9 is a top view showing the modified example of the optical semiconductor device according to the fourth embodiment of the present invention.

FIG. 9 is a top view showing the modified example of the optical semiconductor device according to the fourth embodiment of the present invention. In addition to the configuration of the fourth embodiment, phase regulators 6 are respectively provided in the optical waveguides 5c, 5d, and 5e. The phase regulators 6 can also be provided in only one or two of the optical waveguides 5c, 5d, and 5e. The control section 7 adjusts the bias applied to these phase regulators 6, and makes the phase regulators 6 adjust the phase of the reflected light so that the line width of the output light of a plurality of semiconductor lasers 2 is decreased.

Furthermore, in the first to fourth embodiments, an electrical resistor can be provided on the electrode of the phase regulator 6 or the light intensity lowering section 9 to make the resistor produce heat as a heater. Specifically, a forward/reverse bias is not applied to the phase regulator 6 and the light intensity lowering section 9 to change the reflectivity, but their temperatures are varied to change the reflectivity. In this case also, the same effects of the above-described first to fourth embodiments can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-030779, filed on Feb. 15, 2012, including specification, claims, drawings, and summary, on which the Convention priority of the present application is based, is incorporated herein by reference in its entirety.

What is claimed is:

1. An optical semiconductor device comprising:
   a plurality of semiconductor lasers;
   a wave coupling section multiplexing light output by the plurality of the semiconductor lasers;
   first optical waveguides respectively optically connecting respective semiconductor lasers to the wave coupling section;
   a first phase regulator regulating phase of reflected light that is reflected at a reflecting point located in the optical semiconductor device, wherein the reflected light travels toward the plurality of semiconductor lasers;
   a second optical waveguide optically connecting the wave coupling section to the first phase regulator;
   an optical amplifying section amplifying output light of the first phase regulator;
   a third optical waveguide optically connecting an output of the first phase regulator to the optical amplifying section, wherein the first phase regulator adjusts the phase of the reflected light to decrease line width of the light output by the plurality of semiconductor lasers;
   an optical modulator optically connected to an output of the optical amplifying section; and a fourth optical waveguide optically connecting an output of the optical amplifying section to the optical modulator.

2. The optical semiconductor device according to claim 1, further comprising a control section adjusting a bias voltage applied to the first phase regulator, so that the first phase regulator adjusts the phase of the reflected light to decrease the line width of the light output by the plurality of semiconductor lasers.

3. The optical semiconductor device according to claim 1 further comprising a second phase regulator interposed in the fourth optical waveguide, between the optical amplifying section and the optical modulator.

4. The optical semiconductor device according to claim 3, wherein the second phase regulator is connected to the control section and the control section adjusts a bias voltage applied to the second phase regulator so that the second phase regulator adjusts the phase of the reflected light to decrease the line width of the light output by the plurality of semiconductor lasers.

5. The optical semiconductor device according to claim 3 further comprising
a third phase regulator optically connected to an output of the optical modulator; and
a fifth optical waveguide optically connecting the optical modulator to the third phase regulator.

6. The optical semiconductor device according to claim 5, wherein the third phase regulator is connected to the control section and the control section adjusts a bias voltage applied to the third phase regulator so that the third phase regulator adjusts the phase of the reflected light to decrease the line width of the light output by the plurality of semiconductor lasers.

7. The optical semiconductor device according to claim 2 further comprising a plurality of light intensity lowering sections, a respective light intensity lowering section being interposed in each of said first optical waveguides, between a respective laser and the coupling section for controllably absorbing light and lowering intensity of light passing through the respective first optical waveguide.

8. The optical semiconductor device according to claim 7, wherein each of the light intensity lowering sections is connected to the control section and the control section adjusts a bias voltage applied to the light intensity lowering sections so that the intensity of the reflected light is lowered to decrease the line width of the light output by the plurality of semiconductor lasers.

9. The optical semiconductor device according to claim 6 further comprising a plurality of light intensity lowering sections, a respective light intensity lowering section being interposed in each of said first optical waveguides, between a respective laser and the coupling section for controllably absorbing light and lowering intensity of light passing through the respective first optical waveguide.

10. The optical semiconductor device according to claim 9, wherein each of the light intensity lowering sections is connected to the control section and the control section adjusts a bias voltage applied to the light intensity lowering sections so that the intensity of the reflected light is lowered to decrease the line width of the light output by the plurality of semiconductor lasers.

* * * * *